(12) United States Patent
Kanishima et al.

(10) Patent No.: US 11,625,956 B2
(45) Date of Patent: Apr. 11, 2023

(54) MONITORING SYSTEM

(71) Applicant: Kabushiki Kaisha Toshiba, Minato-ku (JP)

(72) Inventors: Yasuhiro Kanishima, Suginami (JP); Takashi Sudo, Fuchu (JP); Hiroyuki Yanagihashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 244 days.

(21) Appl. No.: 16/564,046

(22) Filed: Sep. 9, 2019

(65) Prior Publication Data

US 2020/0143605 A1 May 7, 2020

(30) Foreign Application Priority Data

Nov. 7, 2018 (JP) .............................. JP2018-209910

(51) Int. Cl.
*G07C 3/00* (2006.01)
*G06T 7/00* (2017.01)
*G06F 30/20* (2020.01)

(52) U.S. Cl.
CPC ................ *G07C 3/00* (2013.01); *G06F 30/20* (2020.01); *G06T 7/0004* (2013.01); *G06T 2207/30164* (2013.01)

(58) Field of Classification Search
CPC ............. G07C 3/00; G07C 3/08; G06F 30/20; G06T 7/0004; G06T 2207/30164;
(Continued)

(56) References Cited

U.S. PATENT DOCUMENTS 7,899,646 B2 * 3/2011 Kanevsky ................ G01D 1/14
702/179
2013/0223639 A1 8/2013 Sugiyama
(Continued)

FOREIGN PATENT DOCUMENTS

CN 204482003 U * 7/2015 ............... H04R 1/10
JP 2000-181526 A 6/2000
(Continued)

OTHER PUBLICATIONS

Ikeda, Y, et al., "Retraining Anomaly Detection Model using Autoencoder", The Institute of Electronics, Information and Communication Engineers, IEICE Technical Report IN2017-84 (Jan. 2018), 16 pages (with English Abstract & Computer Generated English Translation).

*Primary Examiner* — Tung S Lau
(74) *Attorney, Agent, or Firm* — Oblon, McClelland, Maier & Neustadt, L.L.P.

(57) ABSTRACT

According to one embodiment, a monitoring system includes a processor. The processor accepts first data output from a first detector. The first detector detects a signal caused by equipment. The processor performs a first determination when a first value is in a first state. The first value indicates a state of the first detector or an environment where the equipment is provided. The first determination determines a condition of the equipment by using a first model and the first data. The processor performs a second determination when the first value is in a second state different from the first state. The second determination determines the condition of the equipment by using a second model and the first data. The second model is different from the first model.

17 Claims, 7 Drawing Sheets

(58) Field of Classification Search
CPC ........... G06T 2207/10024; G06T 2207/10048; G06T 2207/20081; G06T 2207/20084; G06T 2207/30108

See application file for complete search history.

(56) References Cited

U.S. PATENT DOCUMENTS

| | | | | |
|---|---|---|---|---|
| 2014/0328488 A1* | 11/2014 | Caballero | ............ | H04B 1/3838 |
| | | | | 381/58 |
| 2015/0160098 A1* | 6/2015 | Noda | .................... | G01M 99/00 |
| | | | | 702/35 |
| 2015/0346066 A1* | 12/2015 | Dutta | .................. | G01M 99/008 |
| | | | | 702/183 |
| 2018/0218255 A1 | 8/2018 | Ueno et al. | | |

FOREIGN PATENT DOCUMENTS

| | | |
|---|---|---|
| JP | 2015-18389 A | 1/2015 |
| JP | 2018-119924 A | 8/2018 |
| WO | WO 2012/070684 A1 | 5/2012 |

* cited by examiner

MONITORING SYSTEM

CROSS-REFERENCE TO RELATED APPLICATIONS

This application is based upon and claims the benefit of priority from Japanese Patent Application No. 2018-209910, filed on Nov. 7, 2018; the entire contents of which are incorporated herein by reference.

FIELD

Embodiments described herein relate generally to a monitoring system.

BACKGROUND

There is a system that determines the condition of equipment by using a model. It is desirable to increase the accuracy of the determination by the system.

DETAILED DESCRIPTION

Figure 1:
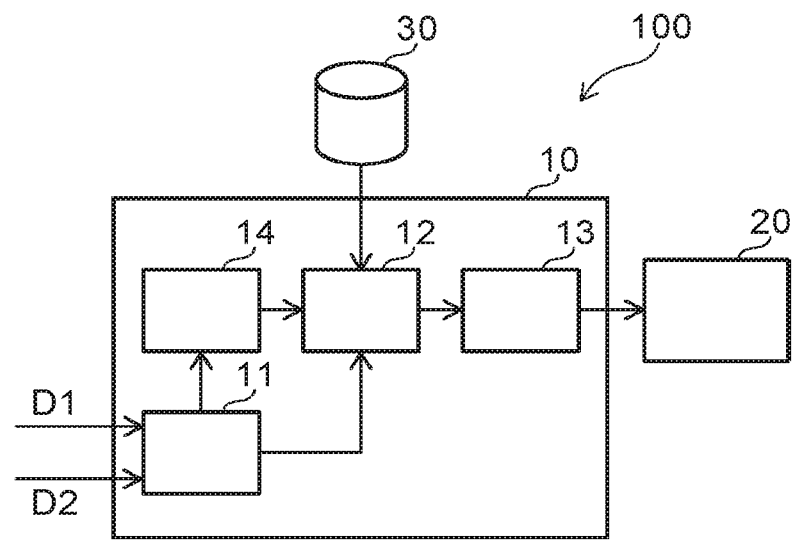
FIG. 1 is a schematic view illustrating the configuration of a monitoring system according to a first embodiment.

According to one embodiment, a monitoring system includes a processor. The processor accepts first data output from a first detector. The first detector detects a signal caused by equipment. The processor performs a first determination when a first value is in a first state. The first value indicates a state of the first detector or an environment where the equipment is provided. The first determination determines a condition of the equipment by using a first model and the first data. The processor performs a second determination when the first value is in a second state different from the first state. The second determination determines the condition of the equipment by using a second model and the first data. The second model is different from the first model.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic view illustrating the configuration of a monitoring system according to a first embodiment.

For example, the monitoring system 100 according to the first embodiment shown in FIG. 1 is used to monitor the condition of equipment.

As shown in FIG. 1, the monitoring system 100 according to the first embodiment includes a processor 10. In the example of FIG. 1, the monitoring system 100 further includes an outputter 20 and a model memory 30.

The processor 10 includes, for example, an acceptor 11, a calculator 12, a determiner 13, and a decider 14. The processor 10 includes, for example, a processing circuit made of a central processing unit (CPU).

The acceptor 11 accepts first detection data D1 output from a first detector, and second detection data D2 output from a second detector. The first detection data D1 is, for example, time-series data. The first detection data D1 may be a value. The second detection data D2 is, for example, a value. The second detection data D2 may be time-series data. Hereinafter, an example is described in which the first detection data D1 is time-series data, and the second detection data D2 is a value.

The first detector detects a "signal" caused by the equipment. The "signal" includes any measurable physical quantity. For example, the "signal" includes at least one of a sound, a vibration, light, or a radio wave generated from the equipment. The "signal" may include at least one of a sound, a vibration, light, or a radio wave reflected by the equipment.

For example, the first detector includes a microphone (mike). For example, the equipment which is the monitoring object is a press machine or a rotating machine. The first detector detects the sound when the press machine presses a processing object, or the sound when the rotating machine rotates. The first detector outputs data based on the sound to the processor 10.

The first detector may include a 3-axis acceleration sensor, a vibration sensor, or an Acoustic Emission (AE) sensor. For example, the first detector detects an acceleration or a vibration when the equipment moves.

The first detector may include a radio wave sensor. For example, the radio wave sensor radiates a radio wave and detects the reflected wave from the equipment. The radio wave sensor is, for example, a doppler sensor and detects the movement of the equipment.

The first detector may include a distance sensor using light or an ultrasonic wave. The distance sensor detects the position or the movement of the equipment by measuring the distance between the distance sensor and the equipment.

The first detector may include an image sensor. For example, the image sensor detects visible light reflected by the equipment. The image sensor may be included in an imaging device (e.g., a camera). The imaging device may generate an image based on visible light detected by the image sensor. The image sensor may detect infrared light. The imaging device may generate an image based on the infrared light detected by the image sensor.

The second detector detects the state of the first detector or the environment where the equipment to be monitored is provided. For example, the second detector includes a 3-axis acceleration sensor mounted to the first detector. The second detector detects at least one of an orientation, a position, or a movement of the first detector and outputs, to the processor 10, a value indicating the at least one of the orientation, the position, or the movement.

The second detector may include a temperature sensor, a humidity sensor, or an atmospheric pressure sensor. The second detector detects the environment such as the temperature, the humidity, the air pressure, etc., where the equipment to be monitored is provided, and outputs a value indicating the environment to the processor 10.

The first detection data D1 that is accepted by the acceptor 11 may be transmitted directly to the processor 10 from the first detector. The first detection data D1 may be generated by the data output from the first detector being processed by another processor. The second detection data D2 that is accepted by the acceptor 11 may be transmitted directly to the processor 10 from the second detector. The second detection data D2 may be generated by the data output from the second detector being processed by another processor.

When accepting the first detection data D1, the acceptor 11 transmits the first detection data D1 to the calculator 12. The calculator 12 refers to the model memory 30. For example, the model memory 30 stores a first model. The calculator 12 calculates an evaluation value indicating the condition of the equipment by using the first model and the first detection data D1.

The first model is, for example, a mathematical model or a physical model. As an example, the first model is a neural network. The first model is trained using data detected by the first detector when the operation starts or directly after maintenance of the equipment. Typically, the condition of the equipment is good when the operation starts or directly after maintenance. In other words, the first model is trained using first detection data when the condition of the equipment is good. For example, the first model is trained using the same data in the input layer and the output layer. The trained first model functions as an autoencoder.

Hereinafter, the condition of the equipment when the first model is generated is called "good." The good condition of the equipment also is called "normal."

The calculator 12 inputs the time-series first detection data X ($X_{t1}$, $X_{t2}$, $X_{t3}$, ..., $X_{tn}$) output from the first detector into the first model and obtains output data Y ($Y_{t1}$, $Y_{t2}$, $Y_{t3}$, ..., $Y_{tn}$) output from the first model. $X_{ti}$ (i=1, 2, 3, ..., n) is the value at a time ti included in the first detection data X. $Y_{ti}$ is the value output when $X_{ti}$ is input to the first model.

If the equipment is normal, output data that is similar to the first detection data is obtained from the first model. If the equipment is abnormal, output data that is not similar to the first detection data is obtained from the first model. The calculator 12 calculates the root mean square of the difference (RMSE) between the first detection data and the output data. Formula 1 shows the calculation formula of the RMSE. The value that is calculated by the RMSE is used as the evaluation value. The evaluation value increases as the condition of the equipment degrades compared to the first model when generated.

$$RMSE = \sqrt{\frac{1}{n}\sum_{k=1}^{n}(y_i - x_i)^2}$$ [Formula 1]

Other than the example described above, a recurrent neural network that includes an intermediate layer having a Long Short Term Memory (LSTM) structure may be used as the first model. For example, the recurrent neural network is generated as a prediction model of the condition of the equipment. The calculator 12 inputs, to the first model, time-series data X1 ($X_{t1}$, $X_{t2}$, $X_{t3}$, ..., $X_{tn}$) output from the first detector at some time. The calculator 12 obtains output data Y2 ($Y_{t2}$, $Y_{t3}$, $Y_{t4}$, ..., $Y_{tn+1}$) output from the first model. The output data Y2 is the predicted value of time-series data X2 ($X_{t2}$, $X_{t3}$, $X_{t4}$, ..., $X_{tn+1}$) output from the first detector at a subsequent time. If the condition of the equipment is good, X2 is similar to the output data Y2. If the condition of the equipment is poor, the similarity between X2 and the output data Y2 decreases. The calculator 12 uses the root mean square of the difference (RMSE) between the first detection data X2 and the output data Y2 as the evaluation value.

The calculator 12 transmits the evaluation value to the determiner 13. The determiner 13 determines the condition of the equipment based on the evaluation value. For example, a large evaluation value indicates that the condition of the equipment is poor. The determiner 13 compares the evaluation value and a first threshold. When the evaluation value is less than the first threshold, the determiner 13 determines that the equipment is in a first condition.

For example, the first condition corresponds to a good condition. When the evaluation value is not less than the first threshold, the determiner 13 determines that the equipment is in a second condition. The second condition indicates that the condition is inferior to the first condition. For example, the second condition corresponds to a poor condition. Hereinafter, the condition of the equipment when the evaluation value is not less than the first threshold is called "poor." A poor condition of the equipment also is called "abnormal."

The determiner 13 transmits the determination result to the outputter 20. The outputter 20 outputs the determination result in a form that is recognizable by the user. The outputter 20 includes, for example, at least one of a monitor, a printer, a speaker, or a light source. A monitor or a printer displays, to the user, at least one of a character, a symbol, or a numerical value indicating the determination result. For example, a speaker emits a tone, music, or a voice indicating the determination result. For example, at least one of a light emission pattern, an intensity, or a color of light that is emitted from a light source changes according to the determination result.

When accepting the second detection data D2 transmitted from the second detector, the acceptor 11 transmits the second detection data D2 to the decider 14. Based on the second detection data D2, the decider 14 decides whether or not the calculation of the evaluation value using the first model is appropriate.

When it is decided that the calculation using the first model is inappropriate, the model that is stored in the model memory 30 is updated. For example, in the update of the model, a second model that is different from the first model is newly generated. Or, the second model may be generated by retraining the first model.

For example, the decider 14 externally transmits the decision result indicating that the use of the first model is inappropriate. When receiving the decision result, an external calculator generates the second model and stores the second model in the model memory 30. Or, when confirming the decision result, the user causes the external calculator to generate the second model and store the second model in the model memory 30.

The second detection data D2 may be transmitted continuously from the second detector to the processor 10. For example, the acceptor 11 transmits the second detection data D2 to the decider 14 only when the first detection data D1 is transmitted to the calculator 12. According to this method, it can be decided whether or not the use of the first model is appropriate at the timing of calculating the evaluation value.

For example, the first model is erased when the second model is stored in the model memory 30. The calculator 12 calculates the evaluation value indicating the condition of the equipment by using the first detection data D1 and the second model stored in the model memory 30.

Or, after storing the second model in the model memory 30, both the first model and the second model may exist in the model memory 30. For example, the decision result of the decider 14 is transmitted to the calculator 12. Based on the decision result of the decider 14, the calculator 12 selects one of the first model or the second model and calculates the evaluation value by using the selected model.

Effects of the first embodiment will now be described.

Typically, the following method is employed when determining the condition of the equipment using some model. First, the model is generated using the signal detected from the equipment when the condition of the equipment is good. Thereafter, an evaluation value is calculated using this model and the signal detected from the equipment. Because the evaluation value changes according to the condition of the equipment, the condition of the equipment can be determined based on the evaluation value.

On the other hand, the evaluation value changes not only according to the condition of the equipment but also according to the state of the first detector. For example, when the first detector is a microphone, the data that is detected by the microphone changes when the orientation of the microphone changes. If the evaluation value changes due to the state of the first detector changing, the condition may be determined to be poor even when the condition of the equipment is good.

For this problem, a method may be considered in which the state of the first detector is returned to the original state when the state of the first detector has changed. However, the first detector may be mounted in a high location or proximal to dangerous equipment. In such a case, it is not easy to return the state of the first detector to the original state. Also, it is not easy to return the first detector accurately to the original state.

Moreover, the evaluation value changes according to the environment where the equipment is provided. For example, when the equipment is provided in a space having low airtightness or outside a building, the temperature, the humidity, or the air pressure of the space where the equipment is provided may change greatly according to changes of the season, etc. Such changes cause the transmission of sound to the microphone to change. As a result, the data that is detected by the microphone changes. It is not easy to calculate the evaluation value while correcting the change of the environment where the equipment is provided.

There is another method in which the model used to calculate the evaluation value is updated regularly. However, in this method, the model is updated even when it is unnecessary to update the model. Therefore, the calculation amount to update the model increases uselessly.

In the monitoring system 100 according to the first embodiment, the data that is output from the second detector is utilized. For example, the first value that indicates the state of the first detector or the environment where the equipment is provided is output from the second detector. In the monitoring system 100, the model that is used to calculate the evaluation value is decided according to the first value.

For example, the processor 10 accepts first data output from the first detector at some time. The processor 10 performs a first determination when the first value is in a first state. In the first determination, the processor 10 determines the condition of the equipment by using the first model and the first data. The processor 10 performs the second determination when the first value is in the second state that is different from the first state. In the second determination, the processor 10 determines the condition of the equipment by using the second model and the first data. Thereby, the condition of the equipment can be determined more accurately even when the state of the first detector or the environment where the equipment is provided changes. The calculation amount that is necessary for the update of the model can be reduced.

The first state may correspond to a first posture of an attached state of the first detector. The second state may correspond to a second posture of the attached state to which the attached state of the first detector has changed from the first posture. The second posture is different from the first posture. The posture of the first detector may change due to drooping by aging of attachment parts, earthquake, or disassembly for maintenance.

For example, the processor 10 compares the first value to a preset second threshold. The first state corresponds to the state in which the first value is less than the second threshold. The second state corresponds to the state in which the first value is not less than the second threshold.

For example, the processor may perform a first determination of determining the equipment using a first data and a first model when a posture of an attached state of the first detector is in a first state. The processor may output a result of the first determination. The processor may perform a second determination of determining the equipment using a first data and a second model different from the first model when the posture of the attached state of the first detector is in a second state different from the first state. The processor may output a result of the second determination.

The object of the monitoring by the monitoring system 100 is, for example, equipment provided in a manufacturing site, a construction site, a power plant, a power substation, an office, a home, a medical institution, etc. By using the monitoring system 100 according to the first embodiment, the condition of such equipment can be determined more accurately.

The monitoring of a press machine and a rotating machine is described in the example described above. A solar panel mounted outside a building, etc., may be monitored by the monitoring system 100. For example, the first detector includes an infrared sensor. The first detector detects infrared light emitted from the solar panel. For example, an image is generated based on the infrared light detected by the first detector. The intensity of the infrared light is proportional to the fourth power of the temperature of the object. Therefore, the image that is based on the infrared light is greatly affected by the temperature. The image that is based on the infrared light also changes when the temperature changes according to the season or the weather. The second detector includes a temperature sensor. The second detector detects the temperature (the air temperature) of the location where the solar panel is provided. The monitoring system 100 modifies the model used to calculate the evaluation value according to the state of the value indicating the temperature. Thereby, even when the season and the weather change, the condition of the solar panel can be determined more accurately.

Figure 2:
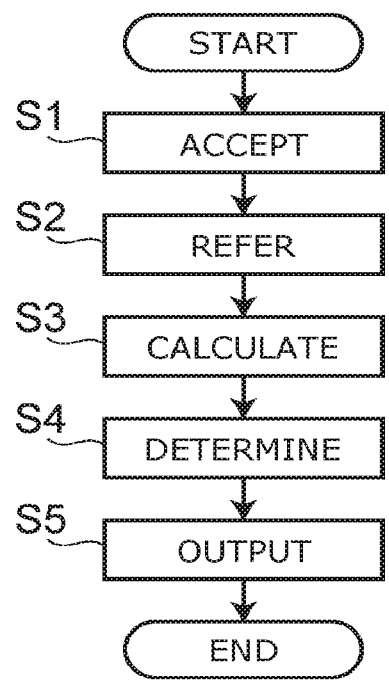
FIG. 2 and FIG. 3 are flowcharts illustrating processing by the monitoring system according to the first embodiment.
Figure 3:
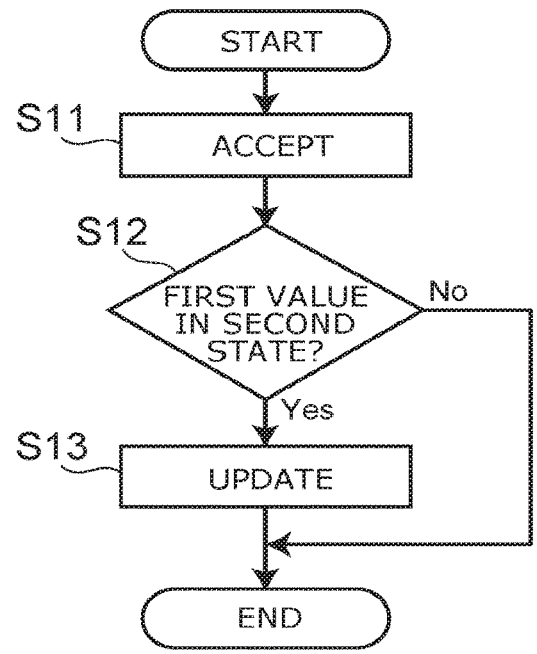

FIG. 2 and FIG. 3 are flowcharts illustrating processing by the monitoring system according to the first embodiment.

FIG. 2 illustrates the processing when the processor 10 accepts the first data output from the first detector. When the acceptor 11 accepts the first data (step S1), the calculator 12 refers to the first model stored in the model memory 30 (step S2). The calculator 12 calculates the evaluation value by using the first model and the first data (step S3). The determiner 13 determines the condition of the equipment based on the evaluation value (step S4). The outputter 20 outputs the determination result (step S5).

FIG. 3 illustrates the processing when the processor 10 accepts the first value output from the second detector. When the acceptor 11 accepts the first value (step S11), the decider 14 decides whether or not the first value is in the second state (step S12). When the first value is in the second state, the model is updated by the calculator (step S13). For example, the second model that is generated separately from the first model is stored in the model memory 30.

The processor 10 may output information indicating the model used to determine the condition of the equipment. For example, the processor 10 outputs first information when the first value is in the first state. The processor 10 outputs second information indicating the second model when the first value is in the second state. Thereby, the user can know which model is used in the determination of the condition of the equipment.

When the model of the model memory 30 is updated, the processor 10 may output information indicating that the model is updated. The user easily can confirm that the model has been updated. The processor 10 may output the first value output from the second detector. For example, the user easily can confirm that the model has been updated based on the first value.

The processor 10 may output the data output from the first detector. Thereby, for example, the user can determine the condition of the equipment based on the data output from the first detector in addition to the determination by the monitoring system 100.

The processor 10 may output the evaluation value. In other words, the processor 10 outputs a first evaluation value calculated using the first data and the first model when the first value is in the first state. The processor 10 outputs a second evaluation value calculated using the first data and the second model when the first value is in the second state. Thereby, for example, the user can know the more specific condition of the equipment based on the evaluation value.

For example, the decider 14 decides whether or not the use of the first model is appropriate when a new evaluation value is calculated by the calculator 12. The decider 14 may decide whether or not the use of the first model is appropriate by using the new evaluation value in addition to the first value output from the second detector.

For example, when the first value is not less than the second threshold, the decider 14 decides to update the model regardless of the new evaluation value.

When the first value is less than the second threshold, the decider 14 decides whether or not the first value is not less than a third threshold. The third threshold is smaller than the second threshold. When the first value is less than the second threshold and not less than the third threshold, the decider 14 refers to the new evaluation value and the evaluation value one-previous. The decider 14 decides to update the model when the difference between the new evaluation value and the evaluation value one-previous is not less than a fourth threshold.

According to this processing, the necessity of the update of the model can be decided more accurately. By appropriately updating the model, the condition of the equipment can be determined more accurately.

The processor 10 may accept both data indicating the state of the first detector and data indicating the environment where the equipment is provided. For example, the processor 10 accepts the first value indicating the state of the first detector, and a second value showing the environment where the equipment is provided. When the first value and the second value are in the first state, the processor 10 performs the first determination determining the condition of the equipment by using the first model and the first data. When at least one of the first value or the second value is in the second state, the processor 10 performs the second determination determining the condition of the equipment by using the second model and the first data. According to this processing, the condition of the equipment can be determined more accurately.

For example, the decider 14 compares the first value to a threshold, and compares the second value to another threshold. The first state corresponds to the case where the first value is less than the threshold and the second value is less than the other threshold. The second state corresponds to the case where the first value is not less than the threshold, the case where the second value is not less than the other threshold, or the case where the first value is not less than the threshold and the second value is not less than the other threshold.

Figure 4:
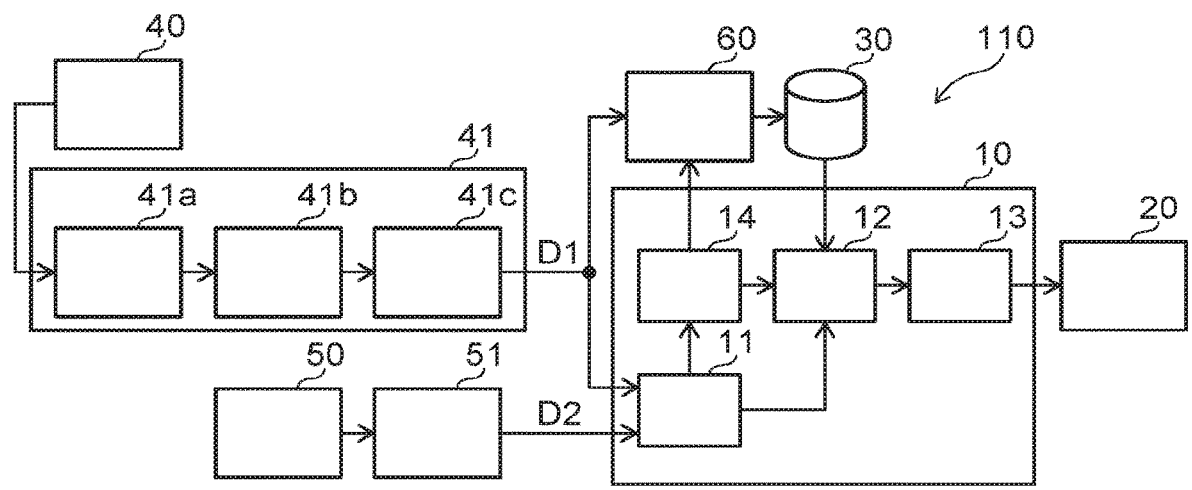
FIG. 4 is a schematic view showing the configuration of a monitoring system according to a first modification of the first embodiment.

FIG. 4 is a schematic view showing the configuration of a monitoring system according to a first modification of the first embodiment.

The monitoring system 110 according to the first modification shown in FIG. 4 further includes a first detector 40, a first detection data processor 41, a second detector 50, a second detection data processor 51, and a calculator 60.

As described above, the first detector 40 detects a signal caused by the equipment. The first detection data processor 41 processes the data detected by the first detector 40. The first detection data processor 41 transmits the processed first detection data D1 to the processor 10.

As described above, the second detector 50 detects the state of the first detector or the environment where the equipment to be monitored is provided. The second detection data processor 51 processes the data detected by the second detector 50. The second detection data processor 51 transmits the processed second detection data D2 to the processor 10.

For example, the first detection data processor 41 also transmits the first detection data D1 to the calculator 60. The calculator 60 updates the model based on the decision result transmitted from the decider 14. For example, the decider 14 decides that the first model is inappropriate. When receiving the decision result, the calculator 60 updates the model by using the first detection data D1 when the decision result is received.

For example, when receiving the decision result, the calculator 60 sets the first detection data D1 to the input layer and the output layer of the model and trains the model. In other words, as an example, the calculator 60 generates another model that functions as an autoencoder. The calculator 60 stores the generated model in the model memory 30.

For example, the following processing is performed in the monitoring system 110.

The processor 10 accepts the first data output from the first detection data processor 41. The processor 10 accepts the first value output from the second detection data processor 51. The processor 10 performs the first determination determining the condition of the equipment by using the first model and the first data when the first value is in the first state. The processor 10 generates the second model by using other data (third data) output from the first detector 40 when the first value is in the second state. After generating the second model, the processor 10 performs the second determination determining the condition of the equipment by using the second model and the first data.

The first detector 40, the first detection data processor 41, the second detector 50, and the second detection data processor 51 will now be described referring to specific examples.

In one specific example, the first detector 40 is a microphone. For example, the first detector 40 detects stationary sound and converts the stationary sound into data (an electrical signal). The stationary sound has a slight fluctuation of the magnitude and frequency of the sound, or has no fluctuation.

The first detection data processor 41 includes a pre-processor 41a, a windowing processor 41b, and a Fourier transformer 41c. The pre-processor 41a splits the data detected by the first detector 40 into frames every K/2 samples. K is an even number. The data that is split into frames is transmitted to the windowing processor 41b. The windowing processor 41b multiplies the split data by w(t) which is a window function. The signal of the input signal $y_n(t)$ (t=0, 1, K/2-1) of the nth frame windowed by w(t) is illustrated by Formula 2.

$$\bar{y}_n(t) = w(t) y_n(t) \quad \text{[Formula 2]}$$

The windowing processor 41b may perform windowing by overlapping parts of two continuous frames. The overlap length is set to 50% of the frame length. The left side obtained in Formula 3 for t=0, 1, ..., K/2-1 is used as the output of the windowing processor 41b.

$$\left. \begin{array}{l} \bar{y}_n(t) = w(t) y_{n-1}(t + K/2) \\ \bar{y}_n(t + K/2) = w(t + K/2) y_n(t) \end{array} \right\} \quad \text{[Formula 3]}$$

The windowing processor 41b may use a laterally-symmetric window function for a real signal. An example of windowing by overlapping 50% of two continuous frames will now be described. For example, the windowing processor 41b uses the hanning window shown in Formula 3 as w(t).

$$w(t) = \begin{cases} 0.5 + 0.5 \cos\left(\dfrac{\pi(t - K/2)}{K/2}\right) & 0 \le t \le K \\ 0, & \text{otherwise} \end{cases} \quad \text{[Formula 4]}$$

Other window functions such as a Hamming window, a Kaiser window, or a Blackman window may be used. The windowed output is transmitted to the Fourier transformer 41c. The Fourier transformer 41c converts the data output from the windowing processor 41b into a frequency spectrum. The frequency spectrum is separated into an amplitude spectrum and a phase spectrum and transmitted to the processor 10 as the first detection data D1. A power spectrum may be used instead of the amplitude spectrum.

The first detection data processor 41 may not include the windowing processor 41b and the Fourier transformer 41c. In such a case, the time domain waveform that is split into frames by the pre-processor 41a is transmitted to the processor 10.

The first detector 40 may detect a shot sound and change the shot sound into data. For example, in the case where the first detector 40 detects a sound generated from a press machine, the shot sound is the sound generated by the pressing. In such a case, the pre-processor 41a extracts an interval including the shot sound from the data detected by the first detector 40.

FIG. 5A to FIG. 5D, FIG. 6A, and FIG. 6B are schematic views describing the processing of the monitoring system according to the first modification of the first embodiment.

Figure 5A:
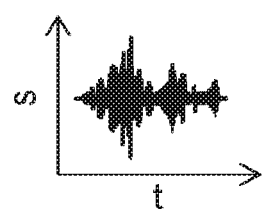
FIG. 5A to FIG. 5D, FIG. 6A, and FIG. 6B are schematic views describing the processing of the monitoring system according to the first modification of the first embodiment.
Figure 5B:
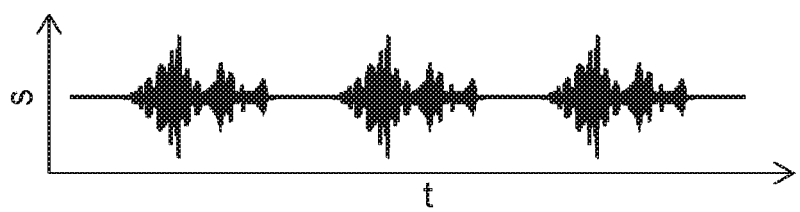
Figure 5C:
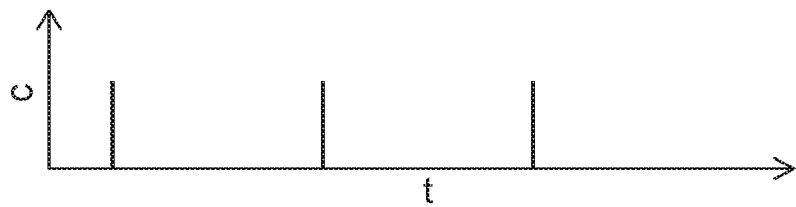

FIG. 5A shows a reference waveform. For example, the reference waveform and the length of time of a shot sound are pre-registered. FIG. 5B shows the data transmitted from the first detector 40. In FIG. 5A and FIG. 5B, the horizontal axis is a time t; and the vertical axis is the magnitude of the sound. The pre-processor 41a calculates a cross-correlation coefficient between the reference waveform shown in FIG. 5A and the data shown in FIG. 5B. FIG. 5C illustrates a cross-correlation coefficient c at each time t.

Figure 5D:
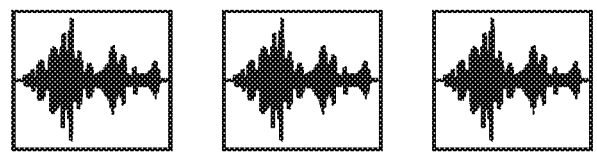

The value of the cross-correlation coefficient value is high at the timing when a waveform similar to the reference waveform appears. The pre-processor 41a sets, as a starting point, a timing that exceeds a prescribed threshold and is when the cross-correlation coefficient has a maximum. From the data shown in FIG. 5B, the pre-processor 41a extracts data having a prescribed length of time from the starting point. FIG. 5D shows the data extracted by the pre-processor 41a.

Thereafter, similarly to the example described above, processing of the extracted data is performed by the windowing processor 41b and the Fourier transformer 41c.

Figure 6A:
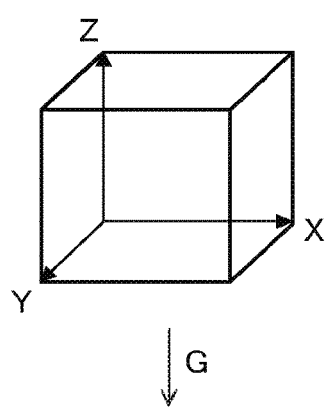

FIG. 6A shows the state of the second detector 50 when the first model is generated. For example, the second detector 50 detects the acceleration of the three axes of the X-axis, the Y-axis, and the Z-axis. When the first model is generated, the X-axis and the Y-axis are along the horizontal plane; and the Z-axis is aligned with the vertical direction.

Figure 6B:
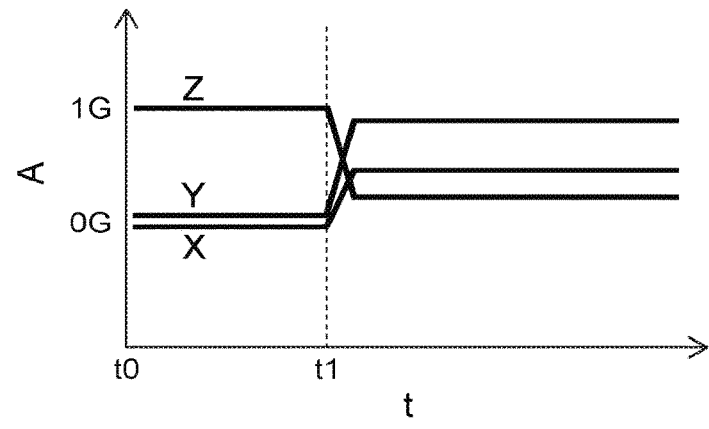

FIG. 6B shows the relationship between the time t and an acceleration A in each axis direction. From a time t0 to a time t1, the acceleration in the Z-axis direction is larger than the accelerations in the X-axis direction and the Y-axis direction. The acceleration changes in each axis direction when the orientation of the first detector 40 changes at the time t1.

For example, the second detection data processor 51 calculates the acceleration in each axis direction by using the signal transmitted from the second detector 50. The second detection data processor 51 calculates an average value A1 from the latest acceleration $V_0$ to an acceleration $V_N$ detected N previously. The second detection data processor 51 calculates an average value A2 from an acceleration $V_1$ detected one-previously to an acceleration $V_{N+1}$ detected N+1 previously. The second detection data processor 51 outputs the difference between the average value A1 and the average value A2 to the processor 10.

The decider 14 compares the difference (the first value) between the average value A1 and the average value A2 to the prescribed second threshold. When the first value is not less than the second threshold, the decider 14 decides that the use of the first model is inappropriate.

The first detection data processor 41 includes, for example, a processing circuit. The first detection data processor 41 may be included in the first detector 40. Or, the processing by the first detection data processor 41 described above may be performed by the processor 10.

The second detection data processor 51 includes, for example, a processing circuit. The second detection data processor 51 may be included in the second detector 50. Or, the processing by the second detection data processor 51 described above may be performed by the processor 10.

The calculator 60 includes, for example, a processing circuit. The processing by the calculator 60 may be performed by the processor 10.

Figure 7:
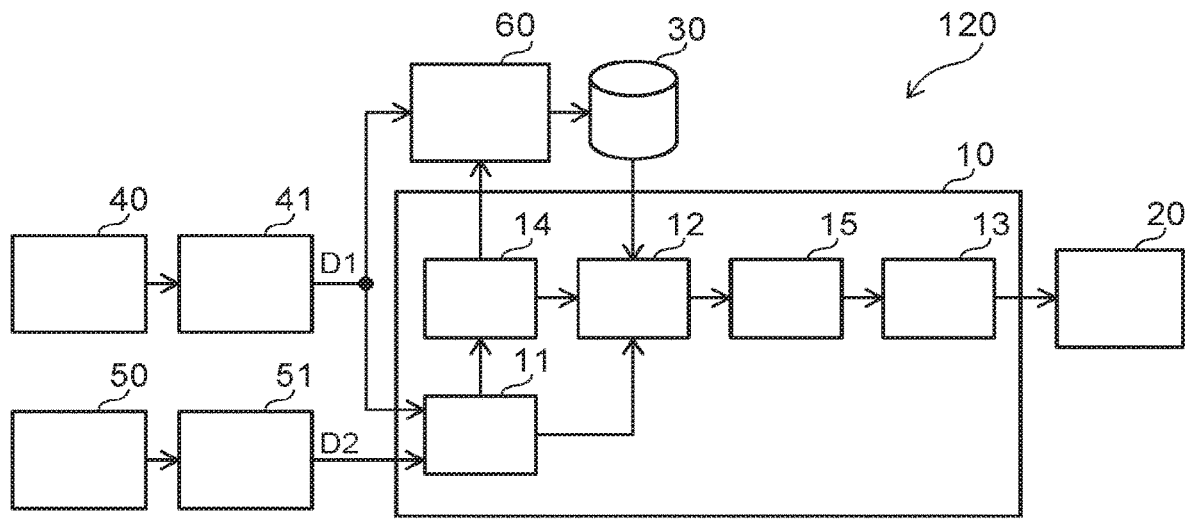
FIG. 7 is a schematic view illustrating the configuration of a monitoring system according to a second modification of the first embodiment.

FIG. 7 is a schematic view illustrating the configuration of a monitoring system according to a second modification of the first embodiment.

In the monitoring system 120 according to the second modification shown in FIG. 7, the processor 10 further includes a corrector 15. When the calculator 12 calculates the evaluation value, the calculator 12 transmits the evaluation value to the corrector 15. The corrector 15 corrects the evaluation value based on a previous evaluation value.

FIG. 8A to FIG. 8C and FIG. 9 are schematic views describing the processing of the monitoring system according to the second modification of the first embodiment.

FIG. 8A to FIG. 8C and FIG. 9 are graphs showing the relationship between the time t and an evaluation value E.

Figure 8A:
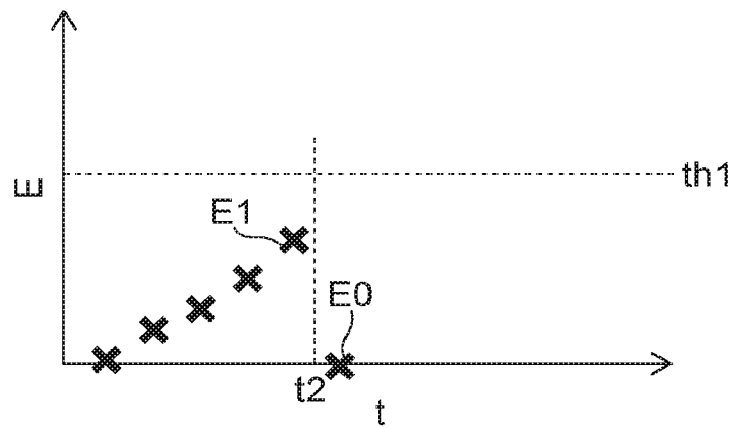
FIG. 8A to FIG. 8C and FIG. 9 are schematic views describing the processing of the monitoring system according to the second modification of the first embodiment.

In the example of FIG. 8A, the evaluation value E increases as the time t elapses. For example, such a characteristic occurs due to the degradation over time of the equipment. For example, the decider 14 decides that the use of the first model is inappropriate at a time t2. The second model is generated by the calculator 60 and stored in the model memory 30. In such a case, an evaluation value E0 that is calculated at or after the time t2 is a value near zero.

In the example of FIG. 8A, an evaluation value E1 is a value less than a first threshold th1 but greater than zero. In other words, compared to when the condition of the equipment is good, the condition of the equipment is degraded when calculating the evaluation value E1. For example, even if the condition of the equipment is degraded when calculating the evaluation value E1, the second model is generated using the first detection data when calculating. The degradation of the condition of the equipment at or before the time t2 is not reflected in the evaluation value based on the second model. As a result, there is a possibility that the evaluation value based on the second model is less than the first threshold th1 even when the original evaluation value would be not less than the first threshold th1.

For example, the calculator 12 calculates the second evaluation value by using the second model and the first data. The corrector 15 corrects the second evaluation value. For example, the corrector 15 refers to the reference evaluation value when the second model is generated and the second evaluation value is calculated using the first data and the second model. The reference evaluation value is a previous evaluation value calculated before generating of the second model. In other words, the reference evaluation value is calculated using the first model and the first detection data (the second data) transmitted to the processor 10 before generating of the second model. For example, the reference evaluation value is the evaluation value one-previous to the second evaluation value.

Figure 8B:
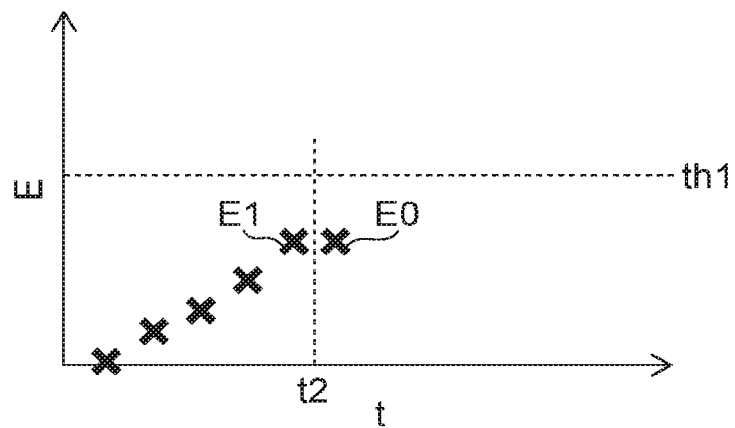

The corrector 15 corrects the second evaluation value based on the reference evaluation value. For example, the corrector 15 adds the reference evaluation value to the calculated evaluation value. FIG. 8B shows the result of this processing. The evaluation value E0 of FIG. 8B shows the result of adding the reference evaluation value E1. By the processing of the corrector 15, the condition of the equipment based on the evaluation value can be determined more accurately.

Figure 8C:
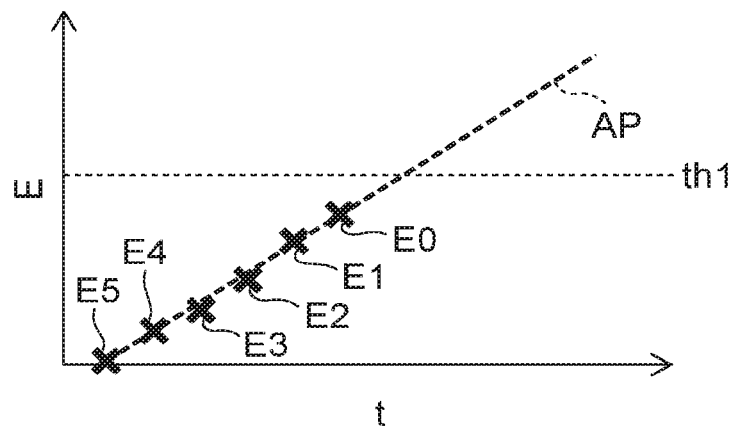

The corrector 15 may calculate an approximation formula for multiple previous evaluation values including the reference evaluation value. The corrector 15 corrects the evaluation value by using the approximation formula. For example, as shown in FIG. 8C, the corrector 15 refers to the previous evaluation values E1 to E5 when correcting the evaluation value E0. The corrector calculates an approximation formula AP illustrating the relationship between the time t and the previous evaluation values E1 to E5. The corrector 15 corrects the evaluation value E0 at or after the time t2 by using the approximation formula AP. According to this processing, an evaluation value that reflects the condition of the equipment more accurately can be obtained. The condition of the equipment based on the evaluation value can be determined more accurately.

An example is shown in FIG. 8C in which the approximation formula is a linear function. The approximation formula that is calculated by the corrector 15 may be a function of second-order or higher-order. For example, as shown in FIG. 9, the approximation formula AP that is a quadratic function may be calculated based on multiple evaluation values.

Figure 9:
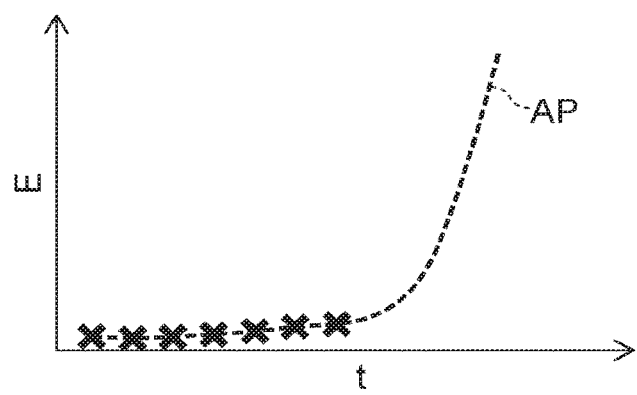

Typically, as shown in FIG. 9, the degradation over time of the condition of the equipment initially is gradual. It is known that when the degradation of the condition of the equipment subsequently starts, the degree of the degradation increases abruptly. By using the approximation formula, the condition of the equipment can be determined more accurately based on the evaluation value even when the change of the condition is large.

Figure 10:
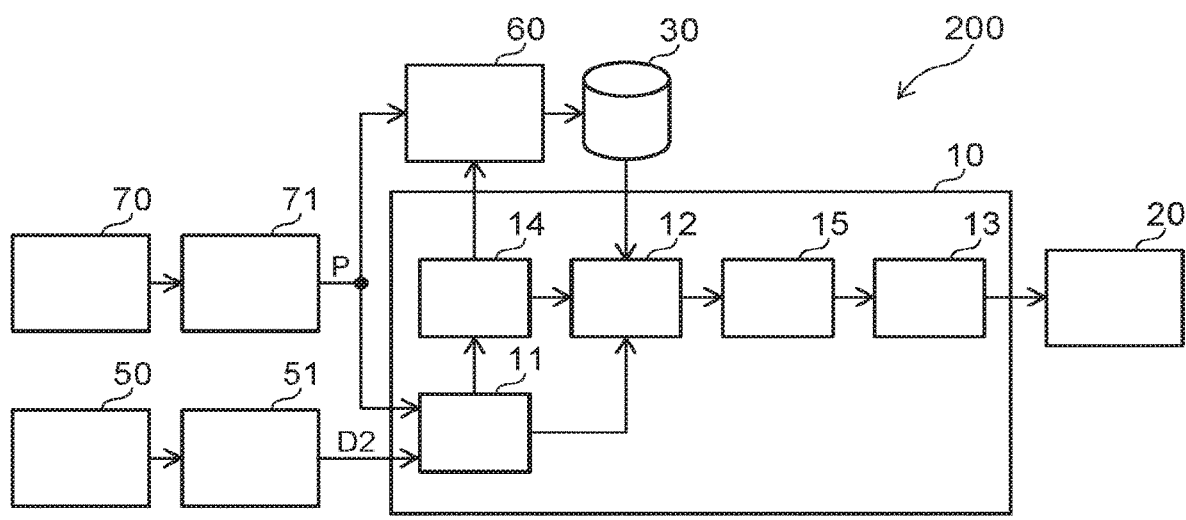
FIG. 10 is a schematic view illustrating the configuration of a monitoring system according to the second embodiment.

FIG. 10 is a schematic view illustrating the configuration of a monitoring system according to the second embodiment.

The monitoring system 200 according to the second embodiment shown in FIG. 10 includes the processor 10. In the example shown in FIG. 10, the monitoring system 200 further includes the outputter 20, the model memory 30, the second detector 50, the second detection data processor 51, the calculator 60, an imager 70, and an imaging data processor 71.

The imager 70 images the article which is the monitoring object and generates an image. The imager 70 includes, for example, a camera. The imager 70 may include an infrared sensor. The imager 70 transmits a generated image P to the processor 10. The image is, for example, a color image. The image includes multiple pixels. For example, each pixel is represented by at least one of red, green, or blue. Each pixel may be represented by a luminance signal, a differential signal of the blue component, and a differential signal of the red component. Or, the image may be represented using a grayscale.

The imager 70 may transmit the image to the imaging data processor 71. For example, the imaging data processor 71 may cut out a part of the image and perform processing as appropriate such as correcting distortion, enlarging, reducing, rotating, grayscaling, binarizing, etc. The imaging data processor 71 transmits the processed image P to the processor 10.

The acceptor 11 accepts the image P. The calculator 12 calculates the evaluation value by using the image P and the first model stored in the model memory 30. Similarly to the first embodiment, the first model is, for example, an autoencoder. The calculator 12 converts the image P into one-dimensional array data and inputs the data to the first model. After calculating the evaluation value, similarly to the monitoring system 120, the determiner 13 determines the condition of the article based on the evaluation value.

Similarly to the monitoring system 100, the decider 14 decides whether or not the calculation of the evaluation value using the first model is appropriate based on the second detection data D2. When it is decided that the use of the first model is inappropriate, the calculator 60 generates the second model that is different from the first model.

For example, the processor 10 accepts the first image output from the imager 70, and the first value output from the second detector 50. The processor 10 performs the first determination when the first value is in the first state. In the first determination, the processor 10 determines the condition of the article by using the first model and the first image. The processor 10 performs the second determination when the first value is in the second state which is different from the first state. In the second determination, the processor 10 determines the condition of the article by using the second model and the first image.

Effects of the second embodiment will now be described.

When determining the condition of the article based on the image of the article, the state of the imager 70 affects the evaluation value. For example, the part of the article that is imaged changes when the position or the orientation of the imager 70 changes. When the imaged part changes, the image also changes; therefore, the evaluation value also changes. As a result, actually, there is a possibility that the condition may be determined to be poor even when the condition of the article is good.

For this problem, there is a method in which the imaged image is corrected based on a previous image. For example, there is a method in which the imaged image is corrected by causing a feature point inside the imaged image and a feature point inside the previous image to match. However, in this method, the correction is difficult when there are few features such as shapes, colors, etc., in the surface of the article. For example, the method for correcting described above cannot be applied when verifying scratches in a designated part of the surface of a metal plate, a semiconductor substrate, wood, etc.

There is also a method in which the correction is performed utilizing the background other than the article inside the image. However, a part of the article may be imaged while enlarging to determine the condition of the article with higher accuracy. Or, a part of the image that is cut out may be used in the determination. In such cases, the background may not be included in the image.

In the monitoring system 200 according to the embodiment, the first value that indicates the state of the imager 70 is output from the second detector 50. In the monitoring system 200, the model that is used to calculate the evaluation value is decided according to the first value. For example, as described above, the processor 10 performs the first determination when the first value is in the first state and performs the second determination when the first value is in the second state. Thereby, the condition of the article can be determined more accurately even when the state of the imager 70 changes. The calculation amount that is necessary for the update of the model can be reduced.

For example, similarly to the monitoring system 100 according to the first embodiment, the processor 10 outputs at least one of the determination result, information indicating the update of the model, the evaluation value, or the first value. The processor 10 may output the image.

In the monitoring system 200, the second detector 50 may detect the environment where the article is provided. The processor 10 may accept the input of the first value indicating the state of the imager 70 or the environment where the article is provided. The processor 10 may accept both the data indicating the state of the imager 70 and the data indicating the environment where the article is provided. For example, the processor 10 accepts the first value indicating the state of the imager 70 and the second value indicating the environment where the article is provided. When the first value and the second value are in the first state, the processor 10 performs the first determination determining the condition of the article by using the first model and the first data. When at least one of the first value or the second value is in the second state, the processor 10 performs the second determination determining the condition of the article by using the second model and the first data. According to this processing, the condition of the article can be determined more accurately.

Figure 11:
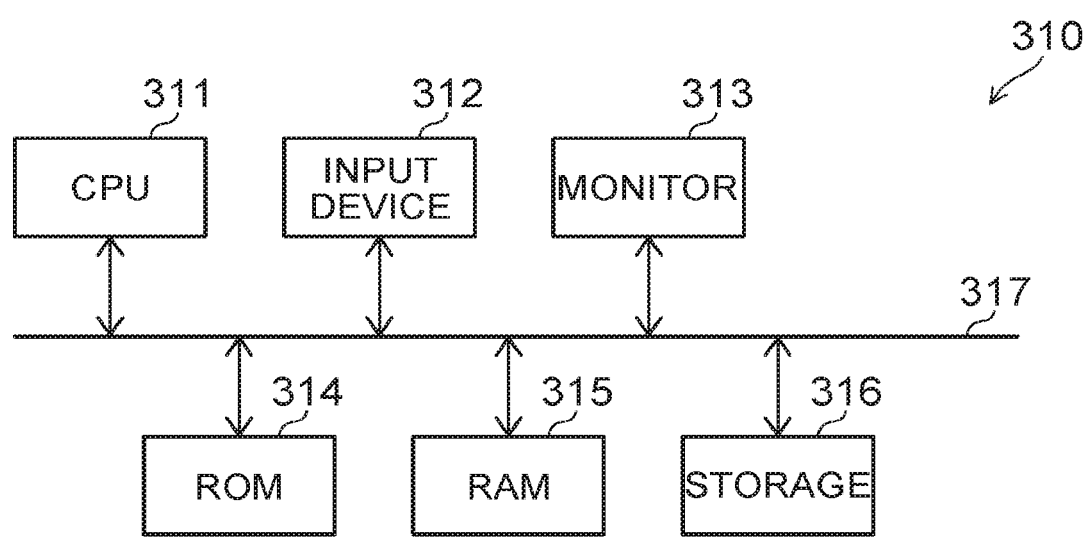
FIG. 11 is a schematic view illustrating the configuration of a monitoring system according to the embodiment.

FIG. 11 is a schematic view illustrating the configuration of the monitoring system according to the embodiment.

For example, the monitoring systems according to the embodiments described above are realized using a computer 310 shown in FIG. 11. The computer 310 includes a CPU (Central Processing Unit) 311, a input device 312, a monitor 313, ROM (Read Only Memory) 314, RAM (Random Access Memory) 315, a storage 316, and a bus 317. The components are connected by the bus 317.

The CPU 311 executes various processing in cooperation with various programs pre-stored in the ROM 314 or the storage 316 and comprehensively controls the operations of the components included in the computer 310. In the processing, the CPU 311 uses a prescribed region of the RAM 315 as a work region. The CPU 311 realizes the input device 312, the monitor 313, the communication device 317, etc., in cooperation with programs pre-stored in the ROM 314 or the storage 316.

The input device 312 includes, for example, at least one of a keyboard, a microphone, or a touch panel. The input device 312 receives the information input from the user as an instruction signal and outputs the instruction signal to the CPU 311. The monitor 313 includes, for example, at least one of a monitor or a speaker. The monitor 313 outputs various information based on the signals output from the CPU 311. The monitor 313 is one example of the outputter 20.

The ROM 314 non-reprogrammably stores programs used to control the computer 310, various setting information, etc. The RAM 315 is a volatile storage medium such as SDRAM (Synchronous Dynamic Random Access Memory), etc. The RAM 315 functions as a work region of the CPU 311. Specifically, the RAM 315 functions as a buffer that temporarily stores various variables, parameters, etc., used by the computer 310, etc.

The storage 316 is a reprogrammable recording device such as a storage medium using a semiconductor such as flash memory or the like, a magnetically or optically recordable storage medium, etc. The storage 316 stores programs used to control the computer 310, various setting information, etc. The storage 316 functions as the model memory 30.

The embodiments may include the following aspects.

Aspect 1

A program, causing a processor to accept first data output from a first detector detecting a signal caused by equipment, perform a first determination when a first value is in a first state, the first value indicating a state of the first detector or an environment where the equipment is provided, the first determination determining a condition of the equipment by using a first model and the first data, and perform a second determination when the first value is in a second state different from the first state, the second determination determining the condition of the equipment by using a second model and the first data, the second model being different from the first model.

Aspect 2

A storage medium storing the program of Aspect 1.

According to the embodiments described above, a monitoring system and a monitoring method can be provided in which the condition of equipment or an article can be determined more accurately.

For example, the processing of the various data recited above is performed based on a program (software). For example, the processing of the various information recited above is performed by a computer storing the program and reading the program.

The processing of the various information recited above may be recorded in a magnetic disk (a flexible disk, a hard disk, etc.), an optical disk (CD-ROM, CD-R, CD-RW, DVD-ROM, DVD±R, DVD±RW, etc.), semiconductor memory, or another recording medium as a program that can be executed by a computer.

For example, the information that is recorded in the recording medium can be read by a computer (or an embedded system). The recording format (the storage format) of the recording medium is arbitrary. For example, the computer reads the program from the recording medium and causes a CPU to execute the instructions recited in the program based on the program. In the computer, the acquisition (or the reading) of the program may be performed via a network.

At least a part of the processing of the information recited above may be performed by various software operating on a computer (or an embedded system) based on a program installed in the computer from a recording medium. The software includes, for example, an OS (operating system), etc. The software may include, for example, middleware operating on a network, etc.

The recording medium according to the embodiments stores a program that can cause a computer to execute the processing of the various information recited above. The recording medium according to the embodiments also includes a recording medium to which a program is downloaded and stored using a LAN, the Internet, etc. The processing recited above may be performed based on multiple recording media.

The computer according to the embodiments includes one or multiple devices (e.g., personal computers, etc.). The computer according to the embodiments may include multiple devices connected by a network.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in monitoring systems such as processors, outputters, model memories, first detectors, second detectors, calculators, imagers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all monitoring systems, monitoring methods, programs, and storage media practicable by an appropriate design modification by one skilled in the art based on the monitoring systems, the monitoring methods, the programs, and the storage media described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A monitoring system comprising a processor accepting first data output from a first detector detecting a signal caused by equipment,
the processor performing a first determination when a first value is in a first state, the first value indicating a state of the first detector, the first determination determining a condition of the equipment by using a first model and the first data, the first model including a neural network, and the first model being trained using a first detection data acquired by the first detector in a state where the condition of the equipment is good,
the processor performing a second determination when the first value is in a second state different from the first state, the second determination determining the condition of the equipment by using a second model and the first data, the second model being different from the first model and including another neural network.

2. The system according to claim 1, wherein
when the first value is in the first state, the processor outputs first information indicating the first model, and
when the first value is in the second state, the processor outputs second information indicating the second model.

3. The system according to claim 1, wherein
when the first value is in the first state, the processor outputs a first evaluation value indicating the condition of the equipment calculated using the first data and the first model, and
when the first value is in the second state, the processor outputs a second evaluation value indicating the condition of the equipment calculated using the first data and the second model.

4. The system according to claim 1, wherein when the first value is in the second state, the processor generates, before the second determination, the second model by using third data output from the first detector.

5. The system according to claim 1, wherein
when the first value is in the first state, the processor outputting a first determination result indicating the condition of the equipment determined using the first model and the first data,
when the first value is in the second state, the processor outputting a second determination result indicating the condition of the equipment determined using the second model and the first data.

6. The system according to claim 1, wherein the first detector is a microphone or a vibration sensor.

7. The system according to claim 1, wherein the first value is detected by a 3-axis acceleration sensor.

8. The system according to claim 1, wherein
the first state corresponds to a first posture of an attached state of the first detector, and
the second state corresponds to a second posture of the attached state to which the attached state of the first detector has changed from the first posture.

9. The system according to claim 1, wherein the neural network is a recurrent neural network.

10. The system according to claim 1, wherein the first model is an autoencoder.

11. The system according to claim 1, further comprising a second detector, wherein
the second detector is mounted to the first detector, and
the second detector outputs the first value.

12. The system according to claim 2, wherein the processor outputs the first value and one of the first information or the second information.

13. The system according to claim 3, wherein
when the first value is in the first state, the processor determines, in the first determination, the condition of the equipment based on the first evaluation value, and
when the first value is in the second state, the processor determines, in the second determination, the condition of the equipment based on the second evaluation value.

14. The system according to claim 3, wherein when the first value is in the second state, the processor refers to a reference evaluation value and corrects the second evaluation value based on the reference evaluation value, the reference evaluation value being calculated using second data and the first model, the second data being output from the first detector before the second determination.

15. The system according to claim 9, wherein the recurrent neural network has a Long Short Term Memory structure.

16. The system according to claim 11, wherein
the second detector includes a 3-axis acceleration sensor, and
the 3-axis acceleration sensor outputs the first value.

17. The system according to claim 12, wherein the processor further outputs the first data.

* * * * *